United States Patent [19]

Yoshida

[11] Patent Number: 5,446,753
[45] Date of Patent: Aug. 29, 1995

[54] CURRENT BLOCK TYPE SEMICONDUCTOR LASER

[75] Inventor: Ichiro Yoshida, Kanagawa, Japan

[73] Assignee: Sumitomo Electric Industries, Ltd., Japan

[21] Appl. No.: 252,563

[22] Filed: Jun. 1, 1994

[30] Foreign Application Priority Data

Jun. 4, 1993 [JP] Japan .................................. 5-134469

[51] Int. Cl.$^6$ .................................................. H01S 3/19
[52] U.S. Cl. .......................................... 372/46; 372/45
[58] Field of Search .................................... 372/45, 46

[56] References Cited

U.S. PATENT DOCUMENTS

| | | | |
|---|---|---|---|
| 5,345,460 | 9/1994 | Takiguchi et al. | 372/45 |
| 5,355,384 | 10/1994 | Inoue et al. | 372/45 |
| 5,363,392 | 11/1994 | Kasukawa et al. | 372/45 |

FOREIGN PATENT DOCUMENTS 5-37078  2/1993  Japan .

OTHER PUBLICATIONS

"0.98 μm InGaAsP/InGaAs/GaAs Strained Quantum Well Lasers With A Buried Ridge Structure", by Sawada et al., extended Abstracts No. 3, 31p-C-11, Japan Society of Applied Physics and Related Societies, published Mar. 29, 1993.

Primary Examiner—James W. Davie
Attorney, Agent, or Firm—Beveridge, DeGrandi, Weilacher & Young

[57] ABSTRACT

An object of the present invention is to provide a semiconductor laser with a current block layer formed on an upper clad layer and composed of GaAs so as to securely close the rays of light in horizontal direction. The present invention is a current block type semiconductor laser having a substrate composed of GaAs where the band gap of an activation layer is smaller than that of GaAs, comprising an AlGaInP (the content of Ga may be zero) formed on the GaAs substrate and opposed main cladding layers except for a stripe-shaped current passageway region and a GaAs auxiliary cladding layer formed on the main cladding layer in the stripe-shaped current passageway region surrounded by the current block layer.

12 Claims, 5 Drawing Sheets

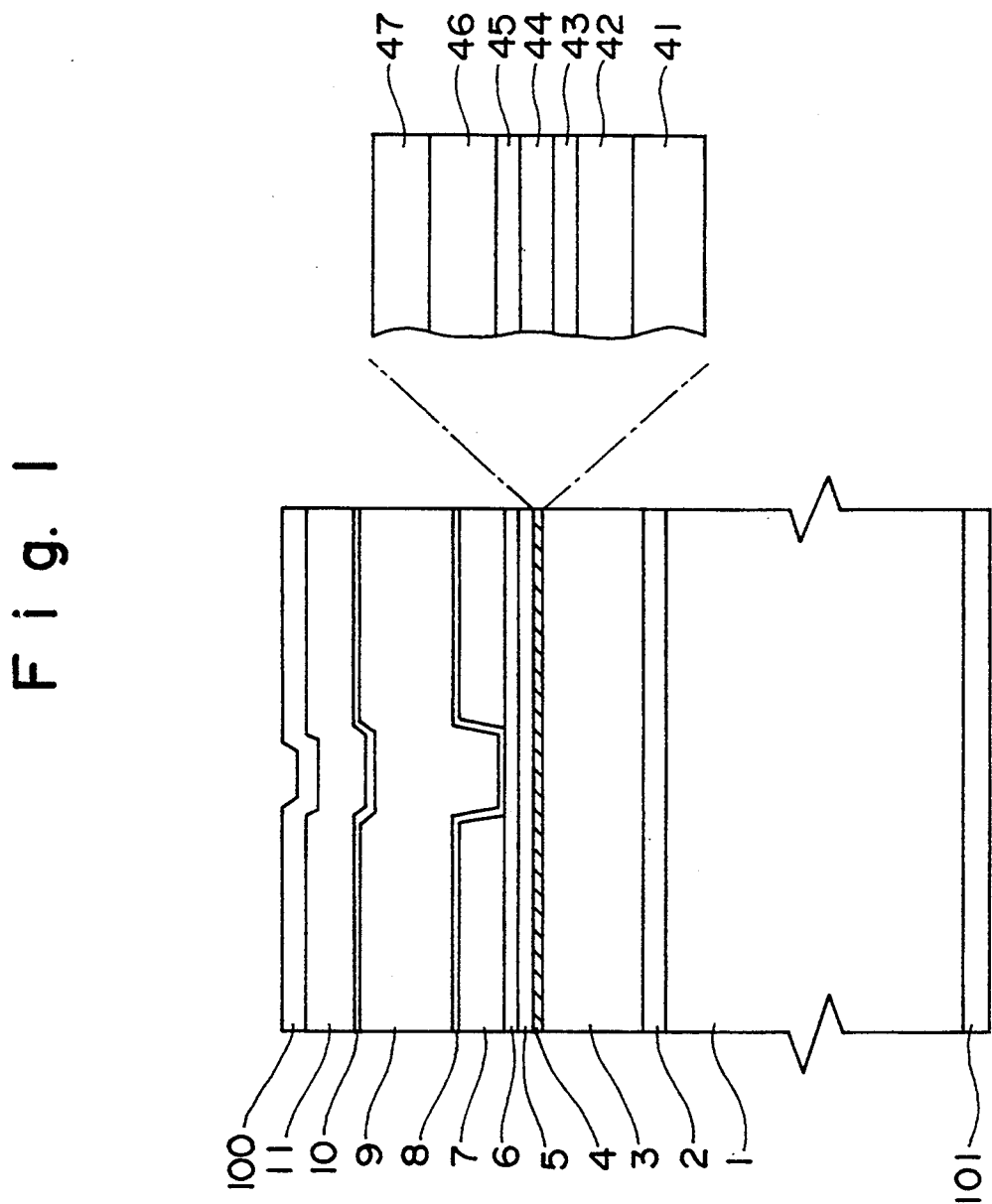

Fig. 2

| LAYER | THICKNESS (μm) | MATERIAL | Aℓ/(Aℓ+Ga) | DOPANT | CONDUCTIVE TYPE | IMPURITY CONCENTRATION |
|---|---|---|---|---|---|---|
| 11 | 0.5 | GaAs | | Zn | p | $1 \times 10^{19}$ |
| 10 | 0.05 | GaInAsP | | Zn | p | $1 \times 10^{19}$ |
| 9 | 1.2 | GaInP | | Zn | p | $5 \times 10^{17}$ |
| 8 | 0.1 | GaAs | | Zn | p | $5 \times 10^{17}$ |
| 7 | 0.5 | AℓGaInP | 0.7 | Si | n | $1 \times 10^{17}$ |
| 6 | 0.1 | GaInP | | Zn | p | $1 \times 10^{18}$ |
| 5 | 0.1 | AℓGaInP | 0.4 | Zn | p | $5 \times 10^{17}$ |
| 47 | 0.01 | GaInP | | UNDOPE | | |
| 46 | 0.01 | GaInAsP | | UNDOPE | | |
| 45 | 0.005 | GaAs | | UNDOPE | | |
| 44 | 0.008 | GaInAs | | UNDOPE | | |
| 43 | 0.005 | GaAs | | UNDOPE | | |
| 42 | 0.01 | GaInAsP | | UNDOPE | | |
| 41 | 0.01 | GaInP | | UNDOPE | | |
| 3 | 1.2 | AℓGaInP | 0.4 | Si | n | $2 \times 10^{17}$ |
| 2 | 0.23 | GaAs | | Si | n | $1.5 \times 10^{19}$ |
| 1 | 300 | GaAs | | Si | n | $2 \times 10^{18}$ |

| | THICKNESS | MATERIAL | Aℓ/(Aℓ+Ga) | DOPANT | n or p |
|---|---|---|---|---|---|
| 58 | 0.5μm | AℓGaInP | 0.7 | Si | 1.0E+17 |
| 57 | 0.1μm | GaInP | | Zn | 1.0E+18 |
| 56 | 0.1μm | AℓGaInP | 0.4 | Zn | 5.0E+17 |
| 55 | 0.01μm | GaInP | | UNDOPE | |
| | 0.01μm | GaInAsP | | UNDOPE | |
| | 0.005μm | GaAs | | UNDOPE | |
| | 0.008μm | GaInAs | | UNDOPE | |
| | 0.005μm | GaAs | | UNDOPE | |
| | 0.01μm | GaInAsP | | UNDOPE | |
| | 0.01μm | GaInP | | UNDOPE | |
| 54 | 0.1μm | AℓGaInP | 0.4 | Si | 2.0E+17 |
| 53 | 1.5μm | GaInP | | Si | 2.0E+17 |
| 52 | 0.23μm | GaAs | | Si | 1.5E+19 |
| 51 | 300μm | GaAs | | Si | 2.0E+18 |

Fig. 5

| | THICKNESS | MATERIAL | Aℓ/(Aℓ+Ga) | DOPANT | n or p |
|---|---|---|---|---|---|
| 66 | 0.5μm | AℓGaInP | 0.7 | Si | 1.0E+17 |
| 65 | 0.2μm | GaInP | | Zn | 1.0E+18 |
| 64 | 0.01μm | GaInP | | UNDOPE | |
| | 0.01μm | GaInAsP | | UNDOPE | |
| | 0.005μm | GaAs | | UNDOPE | |
| | 0.008μm | GaInAs | | UNDOPE | |
| | 0.005μm | GaAs | | UNDOPE | |
| | 0.01μm | GaInAsP | | UNDOPE | |
| | 0.01μm | GaInP | | UNDOPE | |
| 63 | 1.2μm | AℓGaInP | 0.4 | Si | 2.0E+17 |
| 62 | 0.23μm | GaAs | | Si | 1.5E+19 |
| 61 | 300μm | GaAs | | Si | 2.0E+18 |

Fig. 6

| | THICKNESS | MATERIAL | DOPANT | n or p | COMMENT |
|---|---|---|---|---|---|
| 79 | 0.5μm | GaAs | Zn | 5.0E+18 | |
| 78 | 0.04μm | GaInAsp | Zn | 3.0E+18 | |
| 77 | 1.25μm | GaInP | Zn | 1.0E+18 | SECOND AUXILIARY CLAD |
| 76 | 0.03μm | GaAs | Zn | 5.0E+18 | AUXILIARY CLAD |
| 75 | 0.25μm | GaInP | Zn | 1.0E+18 | |
| 74 | 0.015μm | GaInAsP | UNDOPE | | |
| | 0.015μm | GaAs | UNDOPE | | |
| | 0.008μm | GaInAs | UNDOPE | | |
| | 0.015μm | GaAs | UNDOPE | | |
| | 0.015μm | GaInAsP | UNDOPE | | |
| 73 | 1.5μm | GaInP | Si | 2.0E+17 | |
| 72 | 0.23μm | GaAs | Si | 2.0E+17 | |
| 71 | 300μm | GaAs | Si | 2.0E+18 | |

CURRENT BLOCK TYPE SEMICONDUCTOR LASER

BACKGROUND OF THE INVENTION

1. Field of the Invention

The present invention relates to a semiconductor laser, in particular, to a semiconductor laser with a wave band of 1 μm suitable for exciting an optical fiber amplifier.

2. Relative Background Art

In such a semiconductor laser, InP is used for a substrate thereof. A mesa shape region that guides rays of light is formed in an active layer formed by epitaxial growth method. Both side portions of the mesa shape region are buried by high resistance semiconductor. Thus, current and rays of light are confined in the mesa shape region. This construction is known as buried type construction. For a semiconductor laser that has a substrate composed of GaAs, however, it was difficult to accomplish the buried type construction. Though, very recently, a buried type GaAs substrate semiconductor laser with a GaInP cladding was proposed, it will take a long time to place it in the market since the semiconductor laser does not provide high reliability. Accordingly, in a semiconductor laser using a GaAs substrate, a current block layer is formed on an active layer expect a current passage region, that is a center of the active region, without the active layer formed by epitaxial growth method is etched out.

However, in this construction, since the difference of equivalent refractive indexes in horizontal direction cannot be increased, rays of light tend to diffuse in the horizontal direction, thereby decreasing the radiation angle in the horizontal direction. Consequently, the ratio between the radiation angle in a vertical direction and the radiation angle in the horizontal direction becomes large. This ratio is referred to as aspect ratio. As a result, it is difficult to reduce the loss of the connection of the semiconductor laser against an optical fiber cable or the like.

SUMMARY OF THE INVENTION

An object of the present invention is to provide a current block type semiconductor laser having a substrate composed of GaAs with a large radiation angle in a horizontal direction that is close to a radiation angle in a vertical direction.

To accomplish such an object, the semiconductor laser according to the present invention comprises:
a GaAs substrate; and
a multiple layer member formed on the GaAs substrate by epitaxial growth method,
wherein the multiple layer member includes:
an activation layer with a band gap that is smaller than that of GaAs;
a lower main cladding layer formed on a lower side (the substrate side) of the active layer;
an upper main cladding layer formed on an upper side (opposite the substrate side) of the active layer;
a current block layer formed on the upper main cladding layer except for a stripe-shaped current passage region thereof; and
an auxiliary cladding layer formed in the stripe-shaped current passage region on the upper main cladding layer, the refractive index of the auxiliary cladding layer being larger than that of the upper main cladding layer.

A second auxiliary cladding layer is preferably formed on the GaAs auxiliary cladding layer. The second auxiliary cladding layer is composed of AlGaInP (the content of Al or Ga may be zero) or AlGaAs (the content of Ga may be zero). The thickness of the GaAs auxiliary cladding layer is at least 200 Å.

Since the GaAs layer is used as a part of an upper (opposite of the substrate side) cladding layer at a stripe portion (current passage region) surrounded by a current block layer, a distribution of the light at the stripe portion is deviated to the opposite (upper) side of the substrate. In addition, since the current block layer is composed of AlGaInP (the content of Ga may be zero), which has a low refractive index, the rays of light can be securely confined in horizontal direction. In other words, the difference of the equivalent refractive indexes in horizontal direction becomes large.

When a second auxiliary cladding layer that is composed of one of AlGaInP, GaInP and AlGaAs whose refractive indexes are lower than the refractive index of GaAs is formed on the GaAs auxiliary cladding layer, the rays of light can be restricted from diffusing in vertical direction. When the GaAs auxiliary cladding layer is used, the rays of light may excessively diffuse. Thus, the light confining coefficient decreases, thereby deteriorating laser characteristics. In this case, when the second auxiliary cladding layer is used, the decrease of the light confining coefficient can be suppressed.

BRIEF DESCRIPTION OF THE DRAWINGS

FIG. 1 is a sectional view schematically showing a cleavage plane of a semiconductor laser according to a first embodiment of the present invention;

FIG. 2 is a table listing materials, etc. of epitaxial layers of the semiconductor laser of FIG. 1;

FIG. 5 is a sectional view schematically showing the construction of layers of an epitaxial wafer for use in fabricating a semiconductor laser according to a third embodiment of the present invention;

FIG. 6 is a sectional view schematically showing the construction of layers of an epitaxial wafer for use in fabricating a semiconductor layer according to a fourth embodiment of the present invention.

DESCRIPTION OF THE PREFERRED EMBODIMENTS

Figures 3, 4:
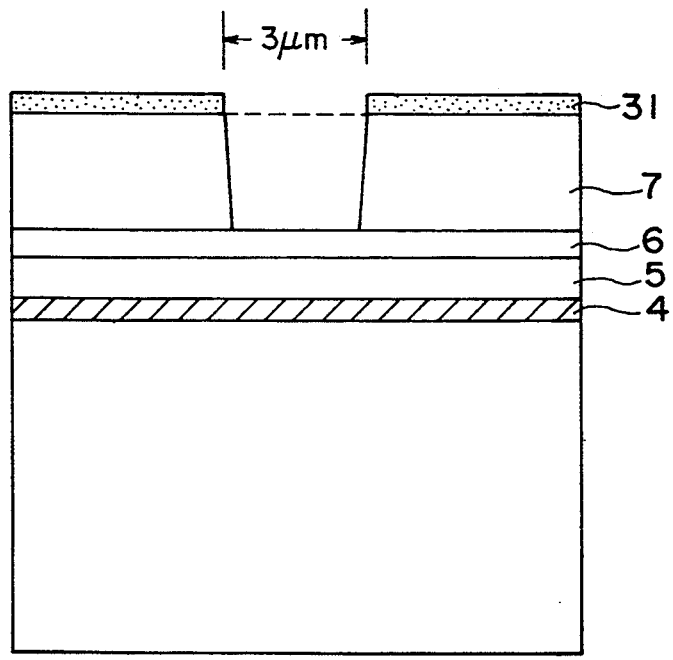
FIG. 3 is a sectional view showing a groove formed in a current block layer formed in a fabrication process of the semiconductor laser of FIG. 1.
FIG. 4 is a sectional view schematically showing the construction of layers of an epitaxial wafer for use in fabricating a semiconductor laser according to a second embodiment of the present invention.

FIG. 1 is a sectional view schematically showing a cleavage of a semiconductor laser according to a first embodiment of the present invention. FIG. 2 is a table listing the thickness, material, composition ratio of Al against (Al+Ga), dopant, conductive type, and impurity concentration of each of semiconductor layers that construct the semiconductor laser.

The semiconductor laser according to the present invention is fabricated in the following manner. First, an eptaxial wafer having a GaAs substrate and multi-epitaxial layer thereon is fabricatd. A GaAs buffer layer 2, an n-type AlGaInP cladding layer 3, an active layer 4, a p-type AlGaInP cladding layer 5, a p-type GaInP cladding layer 6, and an n-type AlGaInP current block layer 7 are formed in the order on the GaAs substrate 1 by reduced pressure MOVPE (Metal Organic Vapor Phase Epitaxial growth method) at a pressure of 60 Torr. The active layer 4 has quantum well construction. The active layer 4 is constructed of a GaInP layer 41, a GaInAsP layer 42, a GaAs layer 43, a GaInAs layer 44, a GaAs layer 45, a GaInAsP layer 46, and a GaInP layer 47. In the active layer 4, the GaInAs layer 44 is a quantum well layer.

When the epitaxial wafer is fabricated, the AlGaInP layers are preferably grown at high temperature. In contrast, the GaInAs layer is preferably grown at low temperature. Thus, the GaAs buffer layer 2 and the n-type AlGaInP cladding layer 3 are grown at a temperature of 740° C. Thereafter, the temperature is lowered to 650° C. At this temperature, the active layer 4 is grown. The p-type AlGaInP cladding layer 5, the p-type GaInP cladding layer 6, and the n-type AlGaInP current block layer 7 are grown at a temperature of 740° C.

A center portion of the n-type AlGaInP current block layer 7, which is the top layer of the epitaxial wafer, is etched out in a stripe shape. As shown in FIG. 3, a silicon nitride film 31 is deposited on the n-type AlGaInP current block layer 7 with a thickness of 0.1 $\mu$m. Thereafter, the center portion is removed for a width of 3 $\mu$m by lithography method. The current block layer 7 is etched out using the silicon nitride film 31 as a mask. As an etching solution, a concentrated sulfuric acid is used at a temperature of for example 60° C. Until the color of the wafer surface is changed, it is etched so that the GaInP layer 6 is exposed.

Thereafter, the silicon nitride film 31 is etched out with hydrofluoric acid and water (1:1). The p-type GaAs layer 8, the p-type GaInP layer 9, the p-type GaInAsP layer 10, and the p-type GaAs layer 11 are re-grown in the order. The P-type GaAs layer 8 at the bottom portion of the stripe-shaped groove, namely the portion formed on the p-type GaInP cladding layer 6, functions as a part of the upper cladding layer. In addition, the p-type GaInP layer 9 on the p-type auxiliary cladding GaAs layer 8 functions as a part of the cladding layer. Since the p-type GaAs auxiliary cladding layer 8 has a high refractive index, it serves to upwardly move the distribution of the rays of light. In contrast, since the refractive index of the p-type GaInP second auxiliary cladding layer 9 is lower than the refractive index of GaAs, the p-type GaInP second auxiliary cladding layer 9 restricts the rays of light from upwardly diffusing out, thereby preventing laser characteristics from deteriorating. The p-type GaInAsP layer 10 and the p-type GaAs layer 11 serve to lower the contact resistance against a p-side electrode disposed thereabove. Since the p-type GaAs auxiliary cladding layer 8 contains only one kind of group III elements, it can be easily regrown.

Thereafter, a p-side electrode metal 100 is formed on the p-type GaAs layer 11 by vapor deposition. The rear surface of the GaAs substrate 1 is abraded so that the thickness thereof becomes approximately 100 $\mu$m. An n-side electrode metal 101 is formed on the rear surface of the GaAs substrate 1 by vapor deposition. The p-side electrode metal 100 and the n-side electrode metal 101 are annealed so that they are alloyed. Thereafter, cleaving process and component mounting process are performed. Thus, the semiconductor laser according to the present invention is fabricated.

The semiconductor laser fabricated in such a way is a gain guiding type semiconductor laser where a narrow current passageway is formed with the current block layer 7. In addition, the semiconductor laser according to the present invention is also a refractive index guiding type semiconductor laser where the difference of refractive indexes of the current block layer 7 and the GaAs auxiliary clad layer 8 is used. Since the refractive index of the GaAs auxiliary cladding layer 8, which is surrounded by the current block layer 7, is high, the distribution of the rays of light is upwardly moved. In addition, since the refractive index of the current block layer 7 is lower than the refractive index of the GaAs auxiliary cladding layer 8, the rays of light are confined in horizontal direction. When the thickness of the current block layer 7 is increasingly changed from 0.5 $\mu$m to for example 1 $\mu$m and the thickness of the p-type GaAs auxiliary cladding layer 8 is increasingly changed from 0.1 $\mu$m to 0.5 $\mu$m, the distribution of the rays of light are further upwardly moved. Thus, the rays of light can be further securely confined. In addition, when the refractive index of the n-type cladding layer 3 on the substrate side (lower side) is decreased, the distribution of the rays of light can be upwardly moved. In this embodiment, the material of the n-type clad layer 3 is AlGaInP. Although the composition ratio of Al against (Al+Ga) is 0.4, when the composition ratio thereof is increased, the refractive index can be decreased.

FIGS. 4 and 5 schematically show the constructions of layers of epitaxial wafers each of which has a substrate and a multi-epitaxial layer including a current block layer according to second and third embodiments of the present invention. Data such as thickness are denoted on the left of the drawings. In the epitaxial wafer according to the second embodiment shown in FIG. 4, an n-side cladding layer is mainly composed of a GaInP layer 53. A thin AlGaInP layer 54 is formed on the GaInP layer 53 as a part of the n-side cladding layer. Thus, the equivalent refractive index of the n-side cladding of the second embodiment is lower than that of the first embodiment. Consequently, the distribution of the rays of light is vertically balanced. Thus, the light confining effect in horizontal direction may lower. A portion with the highest light intensity, however, is close to an active layer 55.

In the epitaxial wafer according to the third embodiment shown in FIG. 5, a p-side cladding layer is composed of only a GaInP layer 65. Thus, since an AlGaInP layer with a low refractive index is not present unlike with the first embodiment, the rays of light that diffuse to the p side increases Consequently the difference of equivalent refractive indexes in horizontal direction becomes large, thereby securely confining the rays of light in horizontal direction.

In the above-described embodiments, although the materials of the current block layers 7, 58, and 66 are AlGaInP, the content of Ga may be zero. In addition, according to the above-described embodiments, although the material of the second auxiliary cladding layer 9 is GaInP, the material thereof may be AlGaInP, AlGaAs, or AlAs.

In the above-described embodiments, a groove is formed in the current block layer, and the GaAs auxiliary cladding layer is re-grown in the groove. Instead, the GaAs auxiliary cladding layer may be left in a stripe shape and a current block layer may be re-grown on both sides thereof. Next, this construction will be described.

Figure 7:
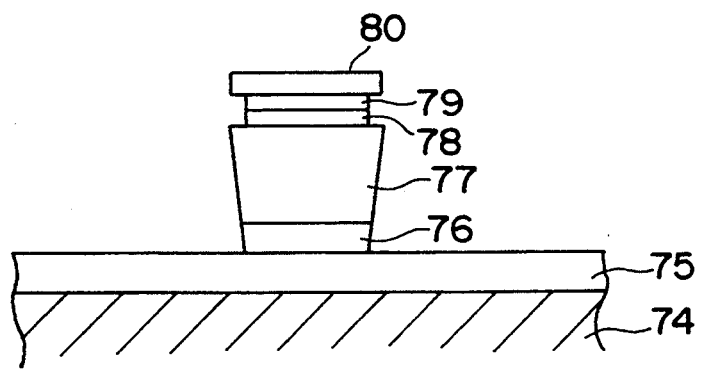
FIG. 7 is a sectional view showing a step in the middle of the fabrication process of the semiconductor laser using the epitaxial wafer of FIG. 6.

An epitaxial wafer shown in FIG. 6 is formed. A silicon nitride film 80 is formed on a stripe region with a width of 5 μm. Thereafter, as shown in FIG. 7, the epitaxial wafer is etched out in an invert mesa shape. At this point, a GaAs layer 79 and a GaInAsP layer 78 are selectively etched out with phosphoric acid, hydrogen peroxide, and water (5:1:40) for 6 minutes so that a GaInP layer 77 is left. Thereafter, the GaInP layer 77 is etched out with hydrochloric acid, phosphoric acid, and water (220:110:165) for 20 minutes so that the GaAs auxiliary cladding layer 76 is left. The GaAs auxiliary cladding layer 76 is etched out with an etchant of phosphoric acid+hydrogen peroxide. With a mask of a silicon nitride film 80, a silicon dope AlGaInP (Al/[Al+Ga]=0.2) (impurity concentration is $2 \times 17$ cm$^{-3}$) is grown for 1.3 μm and a Zn dope GaAs (impurity concentration is $1.5 \times 19$ cm$^{-3}$) for 0.3 μm. Thereafter, the semiconductor laser according to the present invention is fabricated by the conventional fabrication process. A radiation angle of the laser in horizontal direction is as large as 15 degrees. According to this embodiment, the thickness of the GaAs auxiliary cladding layer, which also functions as an etching stopper, is 300 Å. When the thickness of the GaAs auxiliary cladding layer is 100 Å, it does not substantially function as an auxiliary cladding layer. When a semiconductor laser is fabricated with an epitaxial wafer having an etching stopper with a thickness of 100 Å, the radiation angle in horizontal direction is as small as 10 degrees. This is because the etching stopper does not completely function as the auxiliary cladding layer, and the difference of refractive indexes in horizontal direction cannot become large.

As described above, according to the semiconductor laser of the present invention, the AlGaInP current block layer is formed on the cladding layer opposed to the substrate so that the AlGaInP current block layer surrounds the current passageway. In addition, the auxiliary cladding layer composed of GaAs is formed at the portion surrounded by the current block layer. Thus, the difference of equivalent refractive indexes in horizontal direction can be large. Consequently, the radiation angle in horizontal direction can be increased. Moreover, since the difference of equivalent refractive indexes can be adjusted corresponding to the composition and thickness of the materials of the cladding layer, the radiation angle in horizontal direction can be easily adjusted, and the aspect ratio can be adjusted. Consequently, the connection loss of the semiconductor laser against an optical fiber cable can be reduced.

What is claimed is:

1. A current block type semiconductor laser, comprising:
   a GaAs substrate; and
   a multiple layer structure formed on said GaAs substrate, said multiple layer structure including:
   an active layer having a band gap that is smaller than a band gap of GaAs;
   lower and upper main cladding layers sandwiching said active layer, said lower main cladding layer being located between said active layer and said GaAs substrate;
   a current block layer formed on said upper main cladding layer except at a stripe-shaped current passage region;
   a first auxiliary cladding layer formed in the stripe-shaped current passage region; and
   a second auxiliary cladding layer formed on said first auxiliary cladding layer, wherein
   said current block layer has a lower refractive index than said second auxiliary cladding layer, and said first auxiliary cladding layer has a higher refractive index than both said second auxiliary cladding layer and said upper main cladding layer.

2. The current block type semiconductor laser as set forth in claim 1,
   wherein said GaAs substrate, said lower main cladding layer, and said current block layer are composed of a first conductive type semiconductor; and
   said upper main cladding layer and said first auxiliary cladding layer are composed of a second conductive type semiconductor layer.

3. The current block type semiconductor laser as set forth in claim 1,
   wherein the material of said first auxiliary cladding layer is GaAs.

4. The current block type semiconductor laser as set forth in claim 3,
   wherein the material of said current block layer is one of AlGaInP and AlInP.

5. The current block type semiconductor laser as set forth in claim 4,
   wherein the material of said second auxiliary cladding layer is one of AlGaInP, GaInP, AlGaAs, and AlAs.

6. The current block type semiconductor laser as set forth in claim 1,
   wherein said active layer has quantum well construction.

7. The current block type semiconductor laser as set forth in claim 6,
   wherein the material of a quantum well layer in the quantum well construction is GaInAs.

8. The current block type semiconductor laser as set forth in claim 2,
   wherein said first conductive type is n and said second conductive type is p.

9. The current block type semiconductor laser as set forth in claim 1, wherein said upper main cladding layer includes
   a lower layer being in contact with said active layer, and
   an upper layer being in contact with said first auxiliary cladding layer and having a higher refractive index than said lower layer of said upper main cladding layer.

10. The current block type semiconductor laser as set forth in claim 3, wherein said current block layer is a compound semiconductor layer containing Al.

11. A current block type semiconductor laser, comprising:
    a GaAs substrate; and
    a multiple layer structure formed on said GaAs substrate, said multiple layer structure including:
    an active layer having a band gap that is smaller than a band gap of GaAs;
    lower and upper main cladding layers sandwiching said active layer, said lower main cladding layer being located between said active layer and said GaAs substrate;

a AlGaInP layer as a current block layer, formed on said upper main cladding layer except at a stripe-shaped current passage region;

a first auxiliary cladding layer, formed of GaAs in the stripe-shaped current passage region; and a second auxiliary cladding layer, formed of GaInP on said first auxiliary cladding layer.

12. The current block type semiconductor laser as set forth in claim 10, wherein said upper main cladding layer includes an AlGaInP layer being in contact with said active layer, and an GaInP layer being in contact with said first auxiliary cladding layer.

* * * * *